United States Patent
Erpelding et al.

[11] Patent Number: 5,955,176
[45] Date of Patent: Sep. 21, 1999

[54] INTEGRATED SUSPENSION USING A HIGH STRENGTH CONDUCTIVE MATERIAL

[75] Inventors: A. David Erpelding; Darrell D. Palmer; Surya Pattanaik; Oscar J. Ruiz, all of San Jose, Calif.

[73] Assignee: International Business Machines Corporation, Armonk, N.Y.

[21] Appl. No.: 08/972,100

[22] Filed: Nov. 17, 1997

Related U.S. Application Data

[63] Continuation of application No. 08/613,287, Mar. 11, 1996, abandoned, which is a continuation of application No. 08/270,928, Jul. 5, 1994, abandoned, which is a continuation-in-part of application No. 08/213,913, Mar. 15, 1994, abandoned.

[51] Int. Cl.$^6$ .............................. B32B 3/14; B32B 15/08; B32B 15/18; B32B 15/20
[52] U.S. Cl. .......................... 428/209; 428/332; 428/336; 428/337; 428/339; 428/414; 428/416; 428/418; 428/421; 428/422; 428/458; 428/473.5; 428/901; 360/103; 360/104; 360/105; 360/106; 360/107; 360/109; 420/469; 420/485; 420/488; 420/490; 420/492; 420/494
[58] Field of Search ....................................... 428/209, 332, 428/335, 336, 337, 339, 421, 422, 473.5, 413, 414, 416, 418, 458, 901; 360/103, 104, 105, 106, 107, 109; 420/485, 488, 492, 477, 487, 490, 494, 469

[56] References Cited

U.S. PATENT DOCUMENTS

| | | | |
|---|---|---|---|
| 4,167,765 | 9/1979 | Watrous | 360/103 |
| 4,543,295 | 9/1985 | St. Clair et al. | 428/458 |
| 4,594,221 | 6/1986 | Caron et al. | 420/485 |
| 4,732,733 | 3/1988 | Sakamoto et al. | 420/485 |
| 4,760,478 | 7/1988 | Pal et al. | 360/104 |
| 4,761,699 | 8/1988 | Ainslie et al. | 360/103 |
| 4,839,232 | 6/1989 | Morita et al. | 428/473.5 |
| 4,906,803 | 3/1990 | Albrechta et al. | 174/254 |
| 4,937,133 | 6/1990 | Watanabe et al. | 428/209 |
| 4,991,045 | 2/1991 | Oberg | 360/104 |
| 4,996,623 | 2/1991 | Erpelding et al. | 360/104 |
| 5,145,553 | 9/1992 | Albrechta et al. | 156/640 |
| 5,198,945 | 3/1993 | Blaeser et al. | 360/104 |
| 5,298,331 | 3/1994 | Kanakarajan et al. | 428/458 |
| 5,334,346 | 8/1994 | Kim et al. | 420/485 |
| 5,424,030 | 6/1995 | Takahashi | 420/473 |
| 5,427,848 | 6/1995 | Baer et al. | 428/332 |

FOREIGN PATENT DOCUMENTS

| | | |
|---|---|---|
| 0568257A1 | 11/1993 | European Pat. Off. |
| 53-30310 | 3/1978 | Japan. |
| 60-246015 | 12/1985 | Japan. |
| 01-248372 | 3/1989 | Japan. |
| 2193833 | 2/1988 | United Kingdom. |
| WO 92/13345 | 8/1992 | WIPO. |

OTHER PUBLICATIONS

Anonymous disclosure, "Circuitized Suspension Flexure—"Foliage" for Disk Drives," Published in Research Disclosure, No. 339, Kenneth Mason Publications Ltd, England (Jul. 1992).

(List continued on next page.)

*Primary Examiner*—Vivian Chen
*Attorney, Agent, or Firm*—Hopkins & Carley; Donald J. Pagel

[57] ABSTRACT

A slider suspension system for use in a magnetic recording disk file comprised of a laminated suspension positioned between an actuator arm and a read/write slider. The laminated suspension is comprised of a conductor layer, a dielectric layer and a support layer. The conductor layer is comprised of a high strength conductive copper alloy selected from the group consisting of Cu—Ni—Si—Mg alloy, Be—Cu—Ni alloy, and Cu—Ti alloy, wherein the conductive layer has a thickness less than or equal to eighteen microns. The dielectric layer is comprised of an electrically insulating material such as a polyimide. The support layer is comprised of a rigid material such as stainless steel.

19 Claims, 3 Drawing Sheets

OTHER PUBLICATIONS

Cooper et al., "Constrained Layer Damper Spring Assemblies," IBM Technical Disclosure Bulletin, vol. 33, No. 8, pp. 373–374 (Jan. 1991).

Ohwe et al., "Development of Integrated Suspension System for a Nanoslider with an MR Head Transducer," two–page preprint (not dated).

Rogers Corporation, "FLEX–I–MID® Adhesiveless Laminate," Product Data Sheet (not dated).

Mitsui Toatsu Chemicals, Inc. "KOOL BASE®," Product Data Sheet, pp. 1–7 (not dated).

DuPont, "Kapton® EKJ Self–Adhering Polyimide Composite Films," Product Data Sheet (not dated).

INTEGRATED SUSPENSION USING A HIGH STRENGTH CONDUCTIVE MATERIAL

This application is a continuation of Ser. No. 08/613,287, filed on Mar. 11, 1996 (now abandoned), which was a continuation of Ser. No. 08/270,928, filed on Jul. 5, 1994 (now abandoned), which was a continuation-in-part of Ser. No. 08/213,913, filed on Mar. 15, 1994 (now abandoned).

TECHNICAL FIELD

The present invention relates to a suspension for the read/write slider in a data recording disk file and more particularly to a laminated suspension in which one layer is comprised of a high strength conductive material.

BACKGROUND ART

Magnetic recording disk files that utilize a transducer mounted on a slider for reading and/or writing data on at least one rotatable disk are well-known in the art. In such systems, the slider is typically attached to an actuator arm by a suspension system.

The use of laminated materials for constructing slider suspension systems in magnetic disk files is also known in the art. For example, Erpelding et al., in U.S. Pat. No. 4,996,623, issued Feb. 26, 1991, disclose a suspension system comprised of a sheet of polyimide material sandwiched between two metal layers.

Additionally, methods for preparing laminated materials suitable for some electronic uses are known in the art. For example, St. Clair et al., in U.S. Pat. No. 4,543,295, issued Sep. 24, 1985, disclose a laminated material comprised of a polyimide layer sandwiched between a two metal layers. Similarly, Albrechta et al., in U.S. Pat. No. 5,145,553, issued Sep. 8, 1992, disclose a method for making a flexible circuit member comprised of a stainless steel base member, a polyimide dielectric layer and a copper/iron/zinc alloy conductor layer.

It is also known that the discrete lead wires for the head assembly in a disk drive can be replaced by integrated leads formed in the conductor layer. For example, Erpelding et al., in U.S. Pat. No. 4,996,623, disclose a plurality of conductors formed in the copper layer of a suspension for providing electrical connections to the slider.

SUMMARY OF THE PRESENT INVENTION

Briefly, the preferred embodiment of the present invention is a laminated suspension for use in the head gimbal assembly of a magnetic recording disk file. The suspension is attached to the actuator arm and functions as a load beam for supporting a slider that includes a transducer for reading and/or writing data on a magnetic disk.

The laminated suspension is comprised of a conductor layer, a dielectric layer and a support layer. The conductor layer is comprised of a high strength electrically conductive material such as a high strength copper alloy. The dielectric layer is comprised of an electrically insulating material such as a polyimide, polytetrafluoroethylene (e.g. TEFLON brand compounds), or epoxy. The support layer is comprised of a rigid material such as stainless steel, titanium or beryllium copper.

Some of the physical components for the head gimbal assembly, such as electrical leads for the slider and flexures for the suspension, are formed directly in the conductive layer. This simplifies the manufacturing process and reduces the size of the head gimbal assembly. Additionally, the use of high strength materials in the conductive layer facilitates the integration of functional features directly into the conductor layer, thereby allowing the size of the suspension to be reduced. For example, when the flexure is integrated into the conductive layer, the use of a high strength copper alloy for the conductor layer allows the conductor layer thickness to be kept to eighteen microns or less. This is important when a low gimbal stiffness is required.

DETAILED DESCRIPTION OF THE PREFERRED EMBODIMENT

Figure 1:
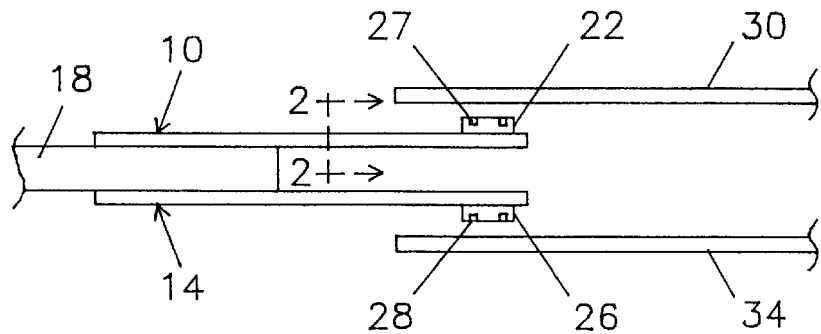
FIG. 1 is a schematic side view of a slider suspension system according to the present invention.

FIG. 1 is a schematic diagram of a first transducer suspension 10 and a second transducer suspension 14 attached to an actuator arm 18. The suspensions 10 and 14 are also referred to as head gimbal assemblies.

A first slider 22 is positioned at an end of the first transducer suspension 10 distally to the arm 18. A second slider 26 is positioned at an end of the second transducer suspension 14 distally to the arm 18. The slider 22 includes one or more data transducers 27 for reading and/or writing data on a magnetic medium such as a hard magnetic disk 30. Similarly, the slider 26 includes one or more data transducers 28 for reading and/or writing data on a magnetic medium such as a hard magnetic disk 34.

Figure 2:
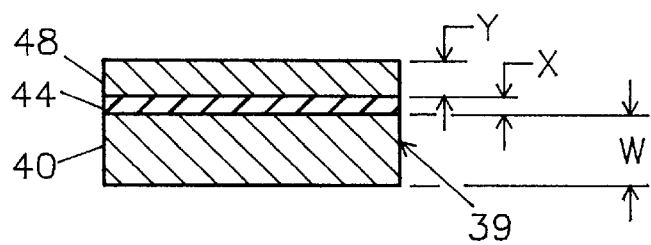
FIG. 2 is a cross-sectional view of the slider suspension system taken along the line 2—2 of FIG. 1.

FIG. 2 is a cross-sectional view of the first transducer suspension 10 illustrating that the suspension 10 is a multilayered laminate 39 comprised of a first layer 40, a second layer 44 and a third layer 48. The first layer 40 is positioned adjacent to one surface of the second layer 44. The third layer 48 is positioned adjacent to a different surface of the second layer 44 so that the second layer 44 separates the first layer 40 and the third layer 48, with the layers 40, 44 and 48 all lying in planes that are parallel to each other. The layers 40, 44 and 48 are generally secured together by a thin adhesive layer applied between layers 40 and 44 and between layers 44 and 48.

Representative dimensions and compositions for the various elements illustrated in FIG. 2 are as follows: In the preferred embodiment, the first layer 40 has a thickness "w" of approximately 0.051 millimeters and comprises full hard 301, 302 or 304 stainless steel. In more general terms, the first layer 40 has a thickness "w" of approximately 0.076 millimeters, or less, and comprises a rigid material such as stainless steel. Typically, the first layer 40 comprises 300 series stainless steel, but other stainless steels and other rigid materials could also be used (e.g. beryllium copper or titanium).

In the preferred embodiment, the second layer 44 comprises a polyimide that has properties similar to the properties of Kapton® E brand polyimide manufactured by E.I. Du Pont de Nemours and Company ("Dupont"), including a dielectric constant in the range of approximately 3.0 to 3.5. Additionally, the coefficient of thermal expansion (CTE) of the polyimide should be such that the laminate 39 will be in a neutral stress condition after the laminate 39 is manufactured. A neutral stress condition means that the laminate 39 will remain flat after manufacturing and will not curl up after either the first layer 40 or the third layer 48 are etched. Furthermore, the adhesive used to secure the layers 40, 44 and 48 together should be sufficiently robust to keep the laminate 39 intact up to a temperature of approximately 350° C.

In the preferred embodiment, the second layer 44 has a thickness "x" of approximately 0.0165 millimeters. This thickness is chosen because a thin layer 44 is needed to keep the stiffness of the suspension 10 low, but the price of polyimide films thinner than 0.0165 millimeters is a limiting consideration.

Rogers Corporation (Circuit Materials Unit), of Chandler, Ariz., supplies a laminate 39 having a second layer 44 that meets the specifications listed above. In ordering the laminate 39, the desired material for the third layer 48, such as one of the alloys described below, is provided to Rogers Corporation along with the specifications for the first layer 40, the second layer 44 and the third layer 48. Rogers Corporation then prepares a suitable laminate using proprietary methods. In the Rogers laminate, the second layer 44 comprises a 0.0165 millimeter polyimide layer (layer 44) which is thought to be the same polyimide (or a similar polyimide) as is used in the Kool Base® brand material manufactured by Mitsui Toatsu Chemicals, Inc. In the Kool Base polyimide, a thin layer of adhesive is applied to each side of the polyimide layer for bonding the layer 44 to the layers 40 and 48.

A substitute for the Rogers laminate is a laminate custom manufactured by Dupont having a 0.0165 millimeter layer of Dupont's EKJ self-adhering polyimide composite (Kapton® E brand polyimide manufactured by Dupont) and meeting the other specifications listed above for the second layer 44.

Stated more generally, the second layer 44 has a thickness "x" of approximately 0.018 millimeters or less, and comprises a dielectric material such as a polyimide having a dielectric constant in the range of approximately 3.0 to 3.5 and a coefficient of thermal expansion (CTE) which allows the laminate 39 to be in a neutral stress condition after the laminate 39 is manufactured.

Polyimides of the types described in U.S. Pat. Nos. 4,839,232, 4,543,295 and 5,298,331 are potentially useful as the second layer 44, although the suitability of a specific polyimide for a particular purpose should be verified. Additionally, polytetrafluoroethylene compounds (e.g. TEFLON brand compounds). of the formula $F(CF_2)_n F$ are also suitable for use in the second layer 44, as are nonconductive epoxies and other dielectric materials.

In the preferred embodiment, the third layer 48 has a thickness "y" of approximately 0.0178 millimeters and comprises a copper-nickel-silicon-magnesium alloy such as the copper alloy C7025 with a TMO3 temper (full hard heat temper) manufactured by Olin Brass (composition 96.2% Cu; 3% Ni; 0.65% Si; and 0.15% Mg).

Examples of other specific materials that can function as the third layer 48 include the following: 1. a high strength beryllium copper alloy (composition: 97.2–98.4% Cu; 0.2–0.6% Be; and 1.4–2.2% Ni, such as Brush Wellman beryllium copper alloy 3 (C17510) with an HT temper); 2. a high strength brass alloy (composition: 97.5% Cu; 2.35% Fe; 0.03% P; and 0.12% Zn, such as Olin Brass copper alloy C194 with an ex. spring temper); 3. a high strength titanium copper alloy (composition: 96.1–96.6% Cu; and 2.9–3.4% Ti, such as Nippon Mining titanium copper alloy with a TiCuR1-EHM temper).

Stated more generally, the third layer 48 comprises a high strength electrically conducting material and has a thickness "y" of approximately 0.018 millimeters or less. For purposes of the present invention, the term "high strength" refers to a material with a tensile yield strength ($S_y$) greater than 70 ksi (kilopounds per square inch) and which doesn't soften by more than 10% when exposed to a temperature of 300° C. for one hour.

Figure 3:
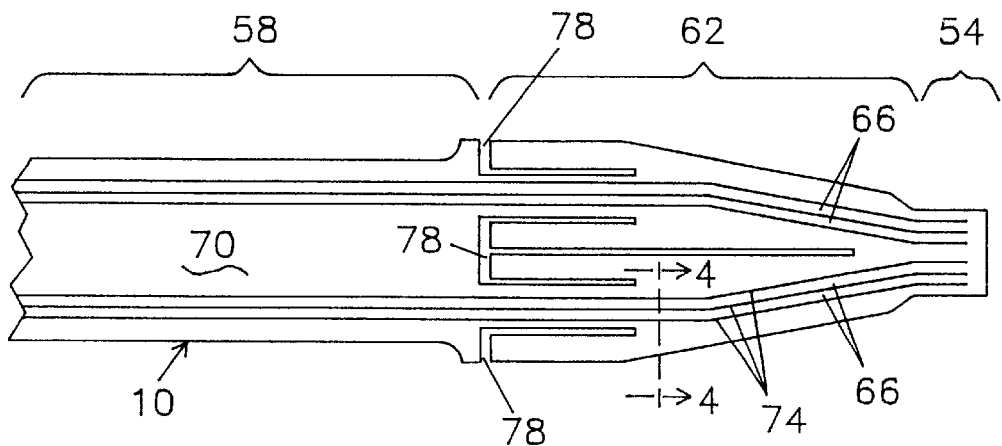
FIG. 3 is a top view of a slider suspension system according to the present invention.

FIG. 3 is a top view of the first transducer suspension 10. The suspension 10 has a slider portion 54, an arm portion 58 and a link portion 62 (also referred to as a load beam). A plurality of electrical lines 66 are present on a surface 70 of the system 10. Each electrical line 66 has a space 74 positioned along each of its sides so as to prevent the electrical line 66 from shorting out with an adjacent electrical line 66.

A plurality of hinges 78 are also shown in the surface 70. The hinges 78 are regions in which the third layer 48 has been removed to form channels in the third layer 48. The hinges 78 increase the flexibility of the suspension 10 and/or permit the suspension 10 to be bent at some predetermined angle. Similarly, hinges can also be formed by etching channels in the first layer 40.

Figure 4:
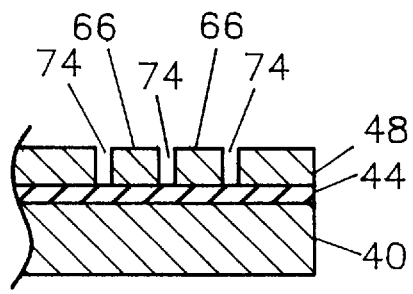
FIG. 4 is a cross-sectional view of the slider suspension system taken along the line 4—4 of FIG. 3.

The portions 54, 58 and 62 designate regions of the suspension 10, but the suspension 10 is preferably formed from one continuous piece of laminated material as is explained herein with respect to FIGS. 2 and 4.

The slider portion 54 is the part of the suspension 10 on which the read/write slider 22 is mounted. The electrical lines 66 form the electrical connections for connecting the slider 22 and the transducer 27 to an external system as is explained later with respect to FIG. 5.

The arm portion 58 is the part of the suspension 10 that is connected to the actuator arm 18. Typically, the arm portion 58 is attached to the actuator arm 18 by bonding, welding, swaging or screwing the arm portion 18 to the actuator arm along the first layer 40 shown in FIG. 2.

The link portion 62 connects the arm portion 58 to the slider portion 54. The suspension 14 is identical to the suspension 10 and includes all of the elements shown in FIG. 3, including the portions 54, 58 and 62 and the electrical lines 66.

FIG. 4 is a cross-sectional view of the suspension 10 illustrating that the electrical lines 66 are regions of the third layer 48 that are roughly rectangular in cross section, and that are separated from each adjacent electrical line 66 by one of the spaces 74. The spaces 74 extend down to the second layer 44 so that the second layer 44 is exposed through the space 74.

The electrical lines 66 are formed by etching the surface 70 using standard metal etching techniques. For example, when the third layer 48 comprises one of the copper alloys described above, the layer 48 is etched with ferric chloride or other suitable etchants. The etching process removes metal from specified regions, thereby forming the spaces 74 that define the electrical lines 66. In practice, a typical chemical etching process will not form a groove having the perfect rectangular shape illustrated in FIG. 4 for the spaces 74. Actual grooves formed by a chemical etching process are slightly rounded or tapered as is well-known in the art. In general, features such as the electrical lines 66, the spaces 74 and the hinges 78 are formed directly on the third layer 48 using photolithographic processes or by using numerically controlled imaging such as laser machining.

In the preferred embodiment, the first, second and third layers 40, 44 and 48 initially comprise a continuous sheet of laminated material of copper alloy/polyimide/stainless steel laminate. A plurality of slider suspension systems 10 are then manufactured from the sheet of laminate using the techniques described above.

A general procedure for the preparation of the metal-polyimide laminated material is described by St. Clair et al. in U.S. Pat. No. 4,543,295 (issued Sep. 24, 1985).

Figure 5:
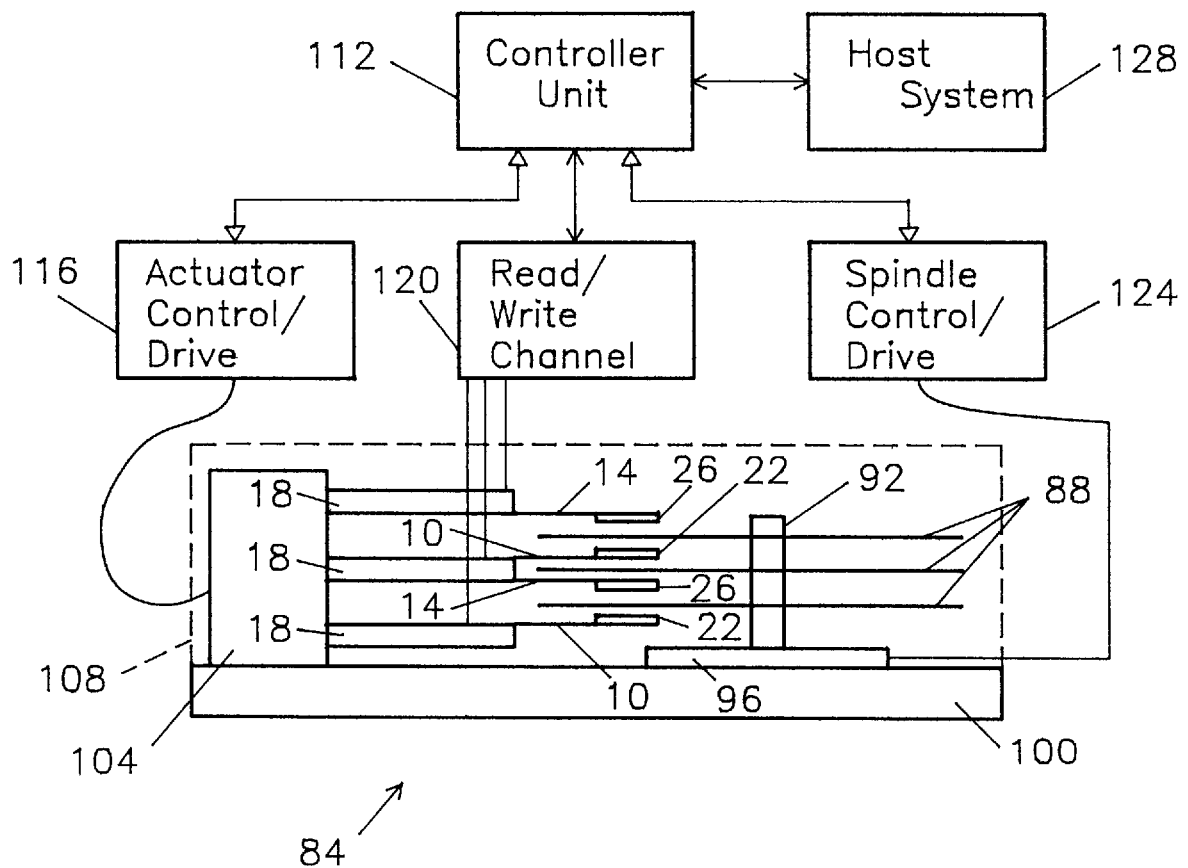
FIG. 5 is a schematic diagram of a disk file that utilizes the slider suspension system according to the present invention.

FIG. 5 is a schematic diagram of a magnetic recording disk file 84 that utilizes the transducer suspension system 10 of the present invention. It should be appreciated that the suspension system 14 is identical to the suspension system 10 so that the following comments apply equally to either the suspension system 10 or the suspension system 14. It should also be appreciated that the suspension systems 10 and 14 could be used with other data storage systems, such as floppy disk drives, optical drives or compact disk players.

The disk file 84 comprises a plurality of magnetic recording disks 88 suitable for use in hard disk drives. The disks 88 are mounted on a spindle shaft 92 which is connected to a spindle motor 96. Motor 96 is mounted to a chassis 100.

The plurality of read/write sliders 22 and 26 are positioned over the disks 88 such that each disk 88 can be accessed by one of the sliders 22 or 26. Each of the sliders 22 and 26 includes a transducer for reading and writing data on a plurality of concentric data tracks on the disks 88 and are attached to one of the suspension systems 10 (or 14). Each of the suspension systems 10 (or 14) are attached to the actuator arm 18 which is attached to a rotary actuator 104. The rotary actuator 104 moves the actuator arm 18 (and hence the suspension system 10 or 14 and the sliders 22 or 26) in a radial direction across the disk 88. An enclosure 108 (shown by a dashed line in FIG. 5) seals the disk file 84 and provides protection from particulate contamination.

A controller unit 112 provides overall control to the system 84. The controller unit 112 contains a central processing unit (CPU), memory unit and other digital circuitry and is connected to an actuator control/drive unit 116 which in turn is electrically connected to the actuator 104. This allows the controller 112 to control the movement of the sliders 22 and 26 over the disks 88. The controller 112 is electrically connected to a read/write channel 120 which in turn is electrically connected to the sliders 22 and 26. This allows the controller 112 to send and receive data from the disks 88. The controller 112 is electrically connected to a spindle control/drive unit 124 which in turn is electrically connected to the spindle motor 96. This allows the controller 112 to control the rotation of the disks 88. A host system 128, which is typically a computer system, is electrically connected to the controller unit 112. The host system 128 may send digital data to the controller 112 to be stored on the disks 88, or may request that digital data be read from the disks 88 and sent to the system 128. The basic operation and structure of data storage systems, such as the disk file 84 (without the suspension systems 10 or 14), is well-known in the art and is described in more detail in *Magnetic Recording Handbook*, C. Dennis Mee and Eric D. Daniel, McGraw-Hill Book Company (1990).

Figure 6:
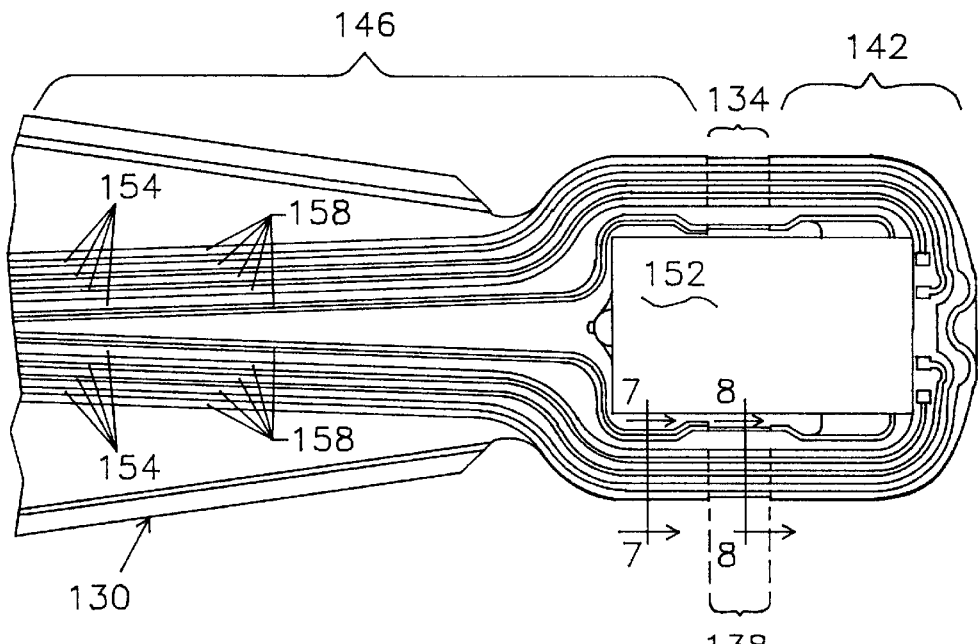
FIG. 6 is a top view of a slider suspension system having a pair of flexures in the head support area according to the present invention.

FIG. 6 is a top view of a transducer suspension 130 having a flexure 134 and a flexure 138. The construction and use of the suspension 130 is analogous to the construction and use of the suspension 10 shown in FIG. 3, and the transducer suspension 130 can be substituted for the suspensions 10 or 14 in the disk file 84 shown in FIG. 5.

Specifically, the suspension 130 has a slider portion 142 analogous to the slider portion 54, a link portion 146 (also referred to as a load beam) analogous to the link portion 62 and an arm portion (not shown) analogous to the arm portion 58. The suspension 130 also includes a slider 152 (which includes one or more data transducers for reading and/or writing data on a magnetic medium) analogous to the slider 22, a plurality of electrical lines 154 analogous to the electrical lines 66 and a plurality of spaces 158 analogous to the spaces 74.

The flexures 134 and 138 are regions of reduced stiffness (compared to the link portion 146) that separate the slider portion 142 from the link portion (load beam) 146 and which function to allow the slider 152 to conform to, and fly over, the recording disk 88.

Figure 7:
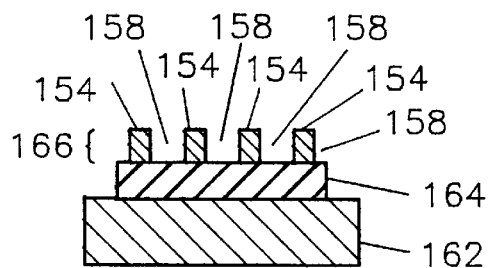
FIG. 7 is a cross-sectional view of the slider suspension system taken along the line 7—7 of FIG. 6.

FIG. 7 is a cross-sectional view of the transducer suspension 130 illustrating that the suspension 130 is a multilayered structure comprised of a first layer 162 analogous to the first layer 40, a second layer 164 analogous to the second layer 44 and a third layer 166 analogous to the third layer 48. The dimensions, compositions and orientations of the layers 162, 164 and 166 are identical to those previously described for the layers 40, 44 and 48 with respect to FIG. 2. In the suspension 130, the layers 162, 164 and 166 are oriented so that the third layer 166 is positioned closest to the disk 88 over which the slider 152 is flying. The laminate 39 shown in FIG. 2 is also oriented this way.

FIG. 7 also illustrates that the electrical lines 154 are regions of the third layer 166 that are roughly rectangular in cross section, and that are separated from each adjacent electrical line 154 by one of the spaces 158. The spaces 158 extend down to the second layer 164 so that the second layer 164 is exposed through the space 158. One of the spaces 158 is positioned along each side of an electrical line 154 so as to prevent the electrical line 154 from shorting out with an adjacent electrical line 154. The electrical lines 154 are formed in the same manner as was previously described for the electrical lines 66.

Figure 8:
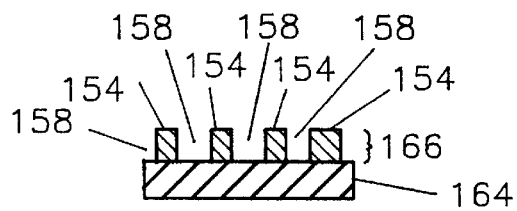
FIG. 8 is a cross-sectional view of the slider suspension system taken along the line 8—8 of FIG. 6.

FIG. 8 is a cross-sectional view illustrating that the flexure 138 comprises a region of the suspension 130 that separates the slider portion 142 from the link portion (load beam) 146 and in which the first layer 162 has been completely removed from underneath the second layer 164 leaving only the layers 164 and 166 to connect the slider portion 142 to the link portion 146. Alternatively, the flexure 138 can comprise a region in which the first layer 162 is only partially removed from underneath the second layer 164. The construction of the flexure 134 is identical to that of the flexure 138.

The total or partial removal of the first layer 162 from underneath the second layer 164 decreases the stiffness of the flexures 134 and 138. The use of a high strength alloy for the third layer 166 gives the flexures 134 and 138 sufficient strength to support the slider portion 142 and the slider 152 (even with the first layer 162 completely or partially removed) while still having the flexibility (low stiffness) required to allow the slider 152 to conform to, and fly over, the recording disk 88.

Referring now to FIGS. 1 and 2, the functioning of the preferred embodiment of the present invention can be explained. The trend within the hard disk drive industry towards smaller drives has created a demand for very small (and low cost) head gimbal assemblies. The laminated structure of the transducer suspension 10 permits very small head gimbal assemblies to be designed especially when the third layer 48 is comprised of a high strength electrical conductor.

The three layers of the suspension 10 function as follows: The first layer 40 (or 162) is a stiffener layer that gives rigidity to the system 10. The second layer 44 (or 164) is comprised of a dielectric material that functions as an electrical insulator between the first layer 40 (or 162) and the third layer 48 (or 166). For some applications, it is useful if the second layer 44 (or 164) is a dielectric material that also has viscoelastic properties (like a polyimide) which increases damping. Viscoelastic means that the stress in a deformed material is proportional to both the deformation and the rate of deformation. Viscoelastic materials also exhibit creep and relaxation behavior. Creep means that under constant stress the deformation increases in time. Relaxation means that under constant fixed deformation the stress decreases steadily in time.

The third layer 48 (or 166) is comprised of a high strength electrically conducting material, such as one of the high strength copper alloys described previously. The third layer 48 (or 166) is preferably comprised of a high conductivity alloy (e.g. a copper alloy) because the electrical lines 66 (or 154) need to function as efficient electrical conductors.

The use of high strength alloys in the third layer 48 (or 166) is important for several reasons: First, the use of a high strength alloy in the conductor layer reduces the stiffness of the suspension 10 (or 130) which is important when the slider 22 (or 152) is small (See Example 2 below).

Second, the use of a high strength alloy permits the thickness of the third layer 48 (or 166) to be kept less than or equal to eighteen microns (as shown in Example 1 below, thickness varies inversely with the square root of yield strength).

Third, the use of a high strength alloy permits more design options such as the integration of the electrical lines 66 (or 154) and the hinges 78 directly into the third layer 48 (or 166). Similarly, the use of a high strength alloy permits the use of the flexures 134 and 138, because the third layer 166 carries most of the load once the first layer 162 has been removed.

Fourth, the high strength copper alloy adds robustness to the suspension and reduces yield losses due to handling damage during the manufacturing process.

EXAMPLE 1

The reason use of a high strength alloy reduces the thickness of the third layer 48 (or 166) is illustrated by the following discussion:

The thickness "t" of a rectangular metal strip having a width "w" and a length "L" is related to the yield strength of the material "$S_y$" by equation 1:

$$t = C/\sqrt{S_y} \tag{1}$$

where C=constant=$(6PL/w)^{1/2}$ and P is the load applied to the metal strip to cause it to bend.

The following calculation uses Equation 1 to illustrate that if the metal strip must carry the same load (P) and is comprised of a second material having a yield strength which is three times greater than the yield strength of a first material, then the metal strip comprised of the second material can be 42% thinner and still have the same strength: If $S_{y1}$, =soft copper yield strength=30 ksi; and $S_{y2}$=high strength copper alloy yield strength=90 ksi; then $t_2/t_1=(S_{y1}/S_{y2})^{1/2}$=0.58 (a 42% reduction in thickness).

EXAMPLE 2

The reason use of a high strength alloy reduces the stiffness of the third layer 48 (or 166) is illustrated by the following discussion:

The stiffness "k" of a rectangular metal strip having a width "w" and length "L" is related to the thickness "t" of the material by equation 2:

$$k = Dt^3 \tag{2}$$

where D=constant=$Ew/6L^3$ and E is Young's modulus.

The following calculation uses Equation 2 and the result of Example 1 to illustrate that if the metal strip must carry the same load (P) and is comprised of a second material having a yield strength which is three times greater than a first material, then the metal strip comprised of the second material has an 81% reduction in stiffness: If $S_{y2}$, =soft copper yield strength=30 ksi; and $S_{y2}$=high strength copper alloy yield strength=90 ksi; then $k_2/k_1=(t_2/t_1)^3=(0.58)^3$=0.19 (an 81% reduction in stiffness).

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A suspension for supporting a data transducer comprising:
    a first layer comprised of a rigid material for providing stiffness to the suspension;
    a second layer comprised of a dielectric material; and
    a third layer comprised of an electrically conductive material selected from the group consisting of Cu—Ni—Si—Mg alloy, Be—Cu—Ni alloy and Cu—Ti alloy, the second layer being positioned between the first layer and the third layer so as to provide electrical insulation between the first layer and the third layer.

2. The suspension of claim 1 wherein the third layer has a thickness of eighteen microns or less.

3. The suspension of claim 1 wherein the rigid material comprises stainless steel.

4. A suspension for supporting a slider in a disk drive comprising:
    an elongated support member for positioning between an actuator arm and a slider, the elongated support member comprising a first layer comprised of a rigid material for providing stiffness to the elongated support member, a second layer comprised of a dielectric material and overlying the first layer, and a third layer comprised of an electrically conductive material selected from the group consisting of Cu—Ni—Si—Mg alloy and Cu—Ti alloy, the third layer overlying the second layer.

5. The suspension of claim 4 wherein the first layer comprises stainless steel.

6. The suspension of claim 4 wherein the second layer comprises a dielectric material selected from the group consisting of a polyimide, an epoxy and a polytetrafluoroethylene.

7. The suspension of claim 4 wherein the third layer has a thickness of eighteen microns or less.

8. The suspension of claim 4 wherein the second layer has a thickness of 16.5 microns or less.

9. The suspension of claim 4 wherein the first layer has a thickness of fifty-one microns or less.

10. The suspension of claim 4 further comprising:

an electrical lead for connection to a data transducer on the slider, the electrical lead comprising an elongated strip of the third layer;

a first channel formed in the third layer and positioned along a first side of the electrical lead, the first channel comprising a region where the third layer has been removed so that the second layer is exposed through the first channel; and a second channel formed in the third layer and positioned along a second side of the electrical lead, the second channel comprising a region where the third layer has been removed so that the second layer is exposed through the second channel.

11. The suspension of claim 4 wherein the group further consists of Be—Cu—Ni alloy.

12. A suspension system for supporting a data transducer comprising:

a data transducer for reading and/or writing data;

a slider for holding the data transducer;

an elongated support member for mechanically supporting the slider, the elongated support member comprising a first layer comprised of a metal alloy, a second layer comprised of a dielectric material and overlying the first layer, and a third layer comprised of an electrically conductive material selected from the group consisting of Cu—Ni—Si—Mg alloy, Be—Cu—Ni alloy and Cu—Ti alloy, the third layer overlying the second layer.

13. The suspension of claim 12 wherein the metal alloy comprises stainless steel.

14. The suspension of claim 12 wherein the second layer comprises a dielectric material selected from the group consisting of a polyimide, an epoxy and a polytetrafluoroethylene.

15. The suspension of claim 12 wherein the third layer has a thickness of eighteen microns or less.

16. The suspension of claim 12 wherein the second layer has a thickness of 16.5 microns or less.

17. The suspension of claim 12 wherein the first layer has a thickness of fifty-one microns or less.

18. The suspension of claim 12 further comprising:

an electrical lead for connection to the data transducer, the electrical lead comprising an elongated strip of the third layer;

a first channel formed in the third layer and positioned along a first side of the electrical lead, the first channel comprising a region where the third layer has been removed so that the second layer is exposed through the first channel; and a second channel formed in the third layer and positioned along a second side of the electrical lead, the second channel comprising a region where the third layer has been removed so that the second layer is exposed through the second channel.

19. The suspension of claim 12 further comprising:

a magnetic data storage medium on which the data transducer can read and/or write data; and an actuator means for moving the slider relative to the magnetic data storage medium.

* * * * *